(12) United States Patent
Hol et al.

(10) Patent No.: US 8,472,010 B2
(45) Date of Patent: Jun. 25, 2013

(54) ACTUATOR, POSITIONING SYSTEM AND LITHOGRAPHIC APPARATUS

(75) Inventors: Sven Antoin Johan Hol, Eindhoven (NL); Antonius Franciscus Johannes De Groot, Someren (NL); Theodorus Petrus Maria Cadee, Vlierden (NL); Marijn Kessels, Geldrop (NL); Daniël Godfried Emma Hobbelen, Amsterdam (NL)

(73) Assignee: ASML Netherlands B.V., Veldhoven (NL)

( * ) Notice: Subject to any disclaimer, the term of this patent is extended or adjusted under 35 U.S.C. 154(b) by 396 days.

(21) Appl. No.: 12/886,996

(22) Filed: Sep. 21, 2010

(65) Prior Publication Data

US 2011/0069293 A1    Mar. 24, 2011

Related U.S. Application Data

(60) Provisional application No. 61/244,761, filed on Sep. 22, 2009.

(51) Int. Cl.
*G03B 27/58* (2006.01)
(52) U.S. Cl.
USPC .......................................................... 355/72
(58) Field of Classification Search
USPC .................. 355/72, 75; 318/135, 115; 310/12
See application file for complete search history.

(56) References Cited

U.S. PATENT DOCUMENTS

| 4,049,983 | A | 9/1977 | Attwood et al. | |
|---|---|---|---|---|
| 7,352,149 | B2 | 4/2008 | Butler et al. | |
| 2004/0051402 | A1* | 3/2004 | Hazelton et al. | 310/12 |
| 2007/0075593 | A1* | 4/2007 | Petro et al. | 310/12 |
| 2008/0309911 | A1* | 12/2008 | De Vos et al. | 355/72 |
| 2009/0128928 | A1* | 5/2009 | Ito | 359/814 |

FOREIGN PATENT DOCUMENTS

| JP | 61-011521 | 4/1986 |
|---|---|---|
| JP | 62-285655 | 12/1987 |
| JP | 7-032578 | 4/1995 |
| JP | 2008-060563 | 3/2008 |

* cited by examiner

*Primary Examiner* — Peter B Kim
(74) *Attorney, Agent, or Firm* — Pillsbury Winthrop Shaw Pittman LLP (57) ABSTRACT

Actuator for exerting a force and a torque on an object, wherein the actuator includes a first part that is movable with respect to a second part of the actuator in at least a first degree of freedom, wherein the object is mounted to the first part, wherein one of the parts is provided with a first electrical coil that is arranged to cooperate with a magnetizable portion of the other part and wherein a controller of the actuator is arranged to generate a first electrical current through the first electrical coil for generating a force between the parts, wherein the one of the parts is provided with a second electrical coil which is arranged to cooperated with a magnetizable portion of the other part, wherein the controller is further arranged to generate a second current through the second coil and the first current through the first electrical coil for exerting the force and torque between the parts so that the actuator is arranged to exert the force and the torque on the object with respect to the second part.

9 Claims, 6 Drawing Sheets

ACTUATOR, POSITIONING SYSTEM AND LITHOGRAPHIC APPARATUS

CROSS REFERENCE TO RELATED APPLICATIONS

This application claims priority and benefit under 35 U.S.C. §119(e) to U.S. Provisional Patent Application No. 61/244,761, entitled "Actuator, Positioning System and Lithographic Apparatus", filed on Sep. 22, 2009. The content of that application is incorporated herein in its entirety by reference.

FIELD

The present invention relates to an actuator configured to exert a force and a torque on an object.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A type of actuator that is well-known in the state of the art is a 'reluctance actuator'. A magnetic flux may for example be generated by applying an electrical current through a coil, wherein the path of the magnetic flux forms a loop depending on the reluctance of the surrounding materials. The magnetic flux is concentrated around the path of least reluctance. The concentration of magnetic flux in low-reluctance materials forms strong temporary poles and causes mechanical forces that tend to move the materials towards regions of higher magnetic flux causing an attractive force. It is also known that reluctance actuators have a very high power density at low-cost, making them ideal for many applications. High power density actuators may for example be used in a lithographic apparatus, while accelerating and decelerating a mask stage, as proposed in U.S. Pat. No. 7,352,149. The use of reluctance actuators has however been limited by the complexity inherent in both design and controllability, which results in a high power density actuator concept but with less accuracy in comparison with e.g. well-known voice coil actuators.

SUMMARY

In one aspect of the invention, there is provided a light-weight actuator with an improved controllability. In one embodiment, one of the parts of the actuator is provided with a second electrical coil which is arranged to cooperate with a magnetizable portion of the other part. In one embodiment, the controller of the actuator is further arranged to generate a second current through the second coil and the first current through the first electrical coil for exerting the force and torque between the parts so that the actuator is arranged to exert the force and the torque on the object with respect to the second part.

This has the technical effect that the actuator is able to generate a (attractive) force and torque around, which results in a compact and light-weight multiple-degree-of-freedom actuator design.

In an embodiment, the magnetizable portion of the first part and/or the magnetizable portion of the second part is a highly permeable material, which is a degree of magnetization of a material that responds linearly to an applied magnetic field. Such a design makes the concept of a reluctance actuator very suitable for high accuracy positioning. Furthermore, due to the beneficial 'mass versus power density'-ratio of the reluctance actuator in comparison with conventionally used high accuracy actuators, the light-weight and high power density properties of the actuator results in a reduced amount of heat that is generated by such an actuator to generate a specific force, for example while accelerating and decelerating a mask stage. Because a reduced amount of heat needs to be cooled away, this results in a reduced required amount of cooler to remain, for example, (a part of) the patterning device stage at a desired constant temperature. A reduced requirement of cooler, like e.g. an amount of cooling fluid, results consequently in fewer crossovers of wires and/or tubes between the first part and the second part, which reduces the amount of stiffness and damping between the first part and the second part, such that less parasitic dynamic force disturbances will act on both parts, which has also a beneficial effect for high accuracy positioning. Also cooling fluid may cause, as well-known, dynamic force disturbances and while reducing the cooler requirement, this also reduces the amount of force disturbances caused by cooling fluids, which also may result in an improved positioning accuracy.

In an embodiment, one of the parts is provided with a third electrical coil, wherein the third coil is substantially split in half into a first coil member and a second coil member such that the coil members are electrically disconnected and wherein the first coil member is connected in series with the first coil and the second coil member is connected in series with the second coil. This has the technical effect that the high (attractive) force and torque around are even better controllable, which consequently results in a higher accuracy.

In another embodiment, the electrical coils have an orientation which is substantially parallel to the first degree of freedom, wherein the third electrical coil is constructed and arranged with an offset with respect to the first and the second electrical coil in a third degree of freedom. Such actuator is able to control the parts in one additional (rotational) degree of freedom, which may be beneficial when controlling the first part and the second part in a multiple degree of freedom set-up, while reducing the relative amount of actuator mass with respect to the actual mass to be moved even further.

In a further embodiment, at least one of the electrical coils is constructed and arranged around at least one of the legs which at least partially consist out of magnetizable material and wherein the at least one of the legs is mounted to one of the parts. Increasing the concentration of magnetic flux by adding the at least one of the legs causes a higher magnetic flux between the parts and accordingly results in an increased attractive force and torque around between the parts. Consequently such high power density actuator can be used to generate higher acceleration and deceleration levels.

Another embodiment relates to a positioning apparatus for positioning the object with respect to a second object in the at least first degree of freedom wherein the positioning apparatus is provided with a positioning system includes at least one actuator according to one of the previous embodiments to move the object in the at least first degree of freedom. The actuator according to an embodiment of the invention is not only able to generate a high normal force, but the actuator can also generate a torque while the mass and dimensions of the actuator are only very limited. This consequently results in a reduced actuator mass compared with a conventional situation wherein at least 2 actuators are required to actuate in two or more directions.

Another embodiment relates to a positioning apparatus, wherein the actuator is considered as an actuator of a first type and wherein the positioning apparatus includes at least one actuator of a second type configured to move the object in at least the first degree of freedom wherein the first type of actuator has a relatively high efficiency and low accuracy and the second type of actuator has a relatively low efficiency and high accuracy. The actuator is provided with an improved controllability and consequently a higher accuracy, which actually means that the maximum force that needs to be generated by the low efficiency and high accuracy actuator, such as a voice-coil actuator, can be further reduced.

In another embodiment, a lithographic apparatus includes the positioning apparatus according to the previous embodiments, wherein the positioning apparatus includes a long stroke module and a short stroke module, an illumination system configured to condition a radiation beam, a patterning device support constructed to support a patterning device, the patterning device being capable of imparting the radiation beam with a pattern in a cross-section to form a patterned radiation beam, a substrate table constructed to hold a substrate, a projection system configured to project the patterned radiation beam onto a target portion of the substrate, wherein the movable part of the long stroke module is mounted to the first part and the movable part of the short stroke module is mounted to the second part.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
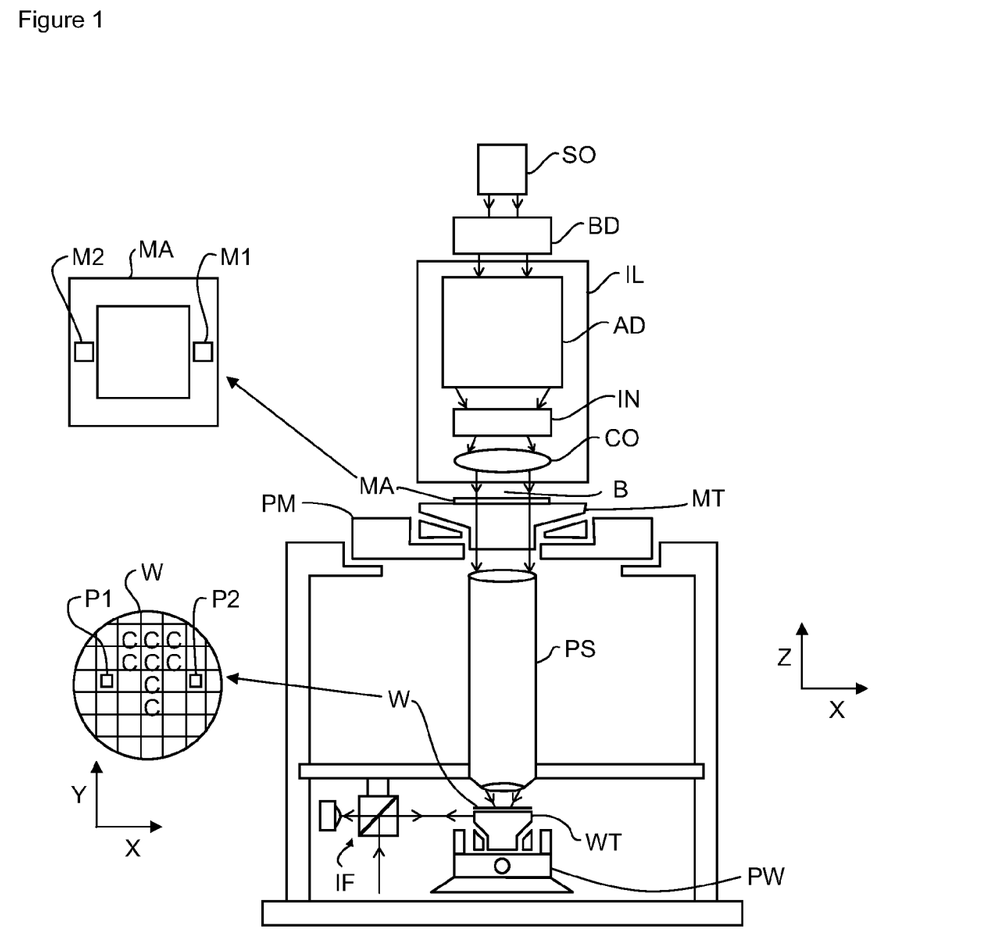
FIG. 1 schematically depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or EUV radiation); a patterning device support or support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the patterning device support (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT and the substrate table WT are scanned synchronously while a pattern imparted to the radiation beam is projected onto a target portion C (i.e. a single dynamic exposure). The velocity and direction of the substrate table WT relative to the patterning device support (e.g. mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
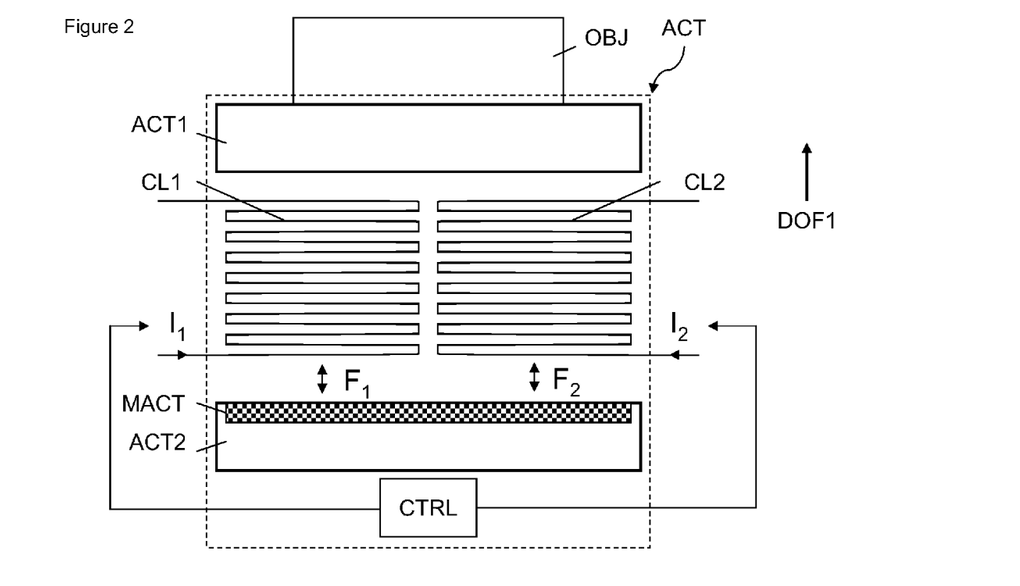
FIG. 2 schematically depicts a side view of an actuator according to an embodiment of the invention.

FIG. 2 schematically depicts a simple cross-sectional view of an actuator according to an embodiment of the invention. The actuator (ACT) to exert a force and a torque on an object (OBJ) includes a first part (ACT1) that is movable with respect to a second part of the actuator (ACT2) in at least a first degree of freedom (DOF1). The object (OBJ) is mounted to the first part (ACT1) and the first part (ACT1) is provided with a first electrical coil (CL1) that is arranged to cooperate with a magnetizable portion (MACT) of the other part (ACT2). A controller (CTRL) of the actuator (ACT) is arranged to generate a first electrical current (I1) through the first electrical coil (CL1) for generating a first force (F1) between the parts (ACT1,ACT2), wherein the first part (ACT1) is provided with a second electrical coil (CL2) which is arranged to cooperated with the magnetizable portion (MACT) of the second part (ACT2). The controller (CTRL) is further arranged to generate a second current (I2) through the second coil (CL2) for generating a second force (F2) between the parts (ACT1,ACT2), and the first current (I1) through the first electrical coil (CL1) for exerting the force and torque between the parts (ACT1,ACT2) so that the actuator (ACT) is arranged to exert the force and the torque on the object (OBJ) with respect to the second part (ACT2).

Figure 3:
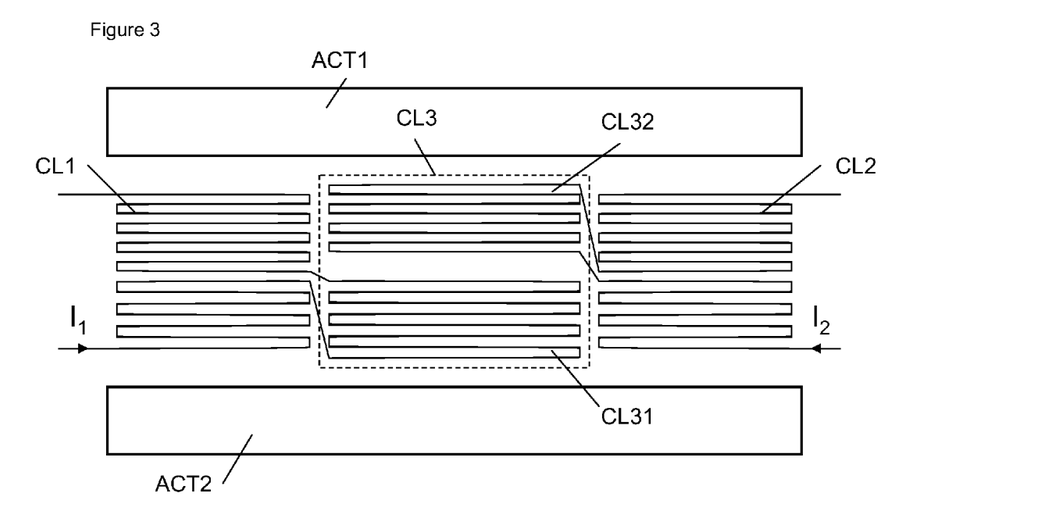
FIG. 3 schematically depicts a side view of an actuator according to another embodiment of the invention.

FIG. 3 schematically depicts a cross-section of an actuator (ACT) according to another embodiment of the invention, wherein one of the parts (ACT1,ACT2) is provided with a third electrical coil (CL3), wherein the third coil (CL3) is substantially split in half into a first coil member (CL31) and a second coil member (CL32) such that the coil members (CL31,CL32) are electrically disconnected meaning that electrical currents through the first coil member (CL31) and the second coil member (CL32) can be applied independently from each other. The first coil member (CL31) is connected in series with the first coil (CL1) and the second coil member (CL32) is connected in series with the second coil (CL2). This actually means that the first current (I1) is only applied through the first electrical coil (CL1) and the first coil member (CL31) and that the second current (I2) is only applied through the second electrical coil (CL2) and the second coil member (CL32).

Figure 4:
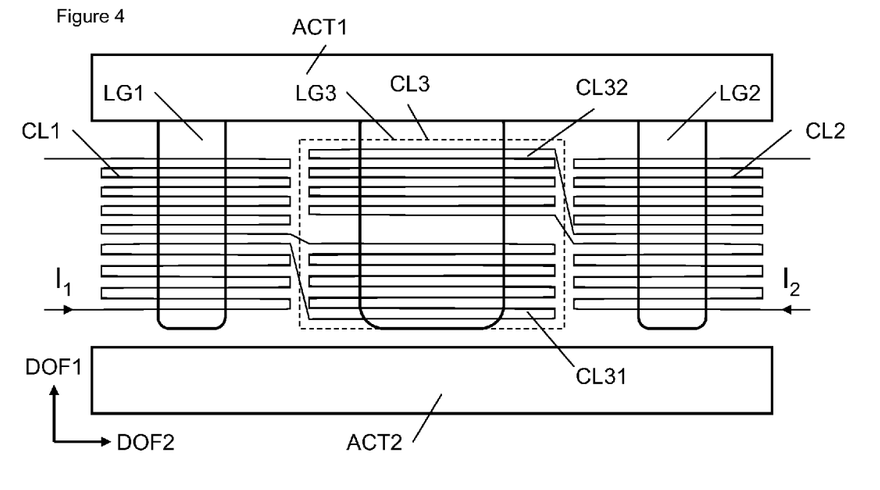
FIG. 4 schematically depicts a side view of an actuator according to an embodiment of the invention.

FIG. 4 schematically depicts a cross-section of an actuator (ACT) according to an embodiment of the invention, wherein the electrical coils (CL1,CL2,CL3) have an orientation which is substantially parallel to the first degree of freedom (DOF1). Furthermore the coils (CL1,CL2,CL3) may be are arranged in a substantially straight line in a second degree of freedom (DOF2) that is oriented substantially perpendicular to the first degree of freedom (DOF1). In this embodiment, the electrical coils (CL1,CL2,CL3) are constructed and arranged around the legs (LG1,LG2,LG3) respectively, which legs at least partially consist out of magnetizable material and wherein the legs are mounted to the part (ACT1). In such a configuration the magnetic flux generated by the electrical coils (CL1,CL2, CL3) is better guided compared with the situation wherein the coils only surround air. The higher magnetic flux between the first part (ACT1) and the second part (ACT2) causes a higher attraction force and torque between the parts (ACT1,ACT2) when an identical first and second current (I1,I2) are applied, compared with a situation wherein only air is present. In a further embodiment the first part (ACT1) is provided with all electrical coils (CL1,CL2,CL3) so that the magnetic flux is even better guided in the parts (ACT1, ACT2). Basically the forces and torque can be derived according to the following equations:

$$F = \frac{1}{2}C_{11} \cdot i_1^2 + C_{12} \cdot i_1 \cdot i_2 + \frac{1}{2}C_{22} \cdot i_2^2$$

$$T = \frac{1}{2}D_{11} \cdot i_1^2 + D_{12} \cdot i_1 \cdot i_2 + \frac{1}{2}D_{22} \cdot i_2^2$$

wherein i1 is the first electrical current which is applied through the first coil (CL1) and the first coil member (CL31) and i2 is the second electrical current which is applied through the second coil (CL2) and the second coil member (CL32) and Cii and Dii are known actuator constants being a function of the distance (i.e. the gap) between the actuators parts (ACT1,ACT2) and the electrical coils (CL1,CL2,CL3). These actuator constants can be calibrated by any suitable calibration method, or may be calculated using a priori knowledge about the actuator configuration and materials using a suitable software package.

Figure 5:
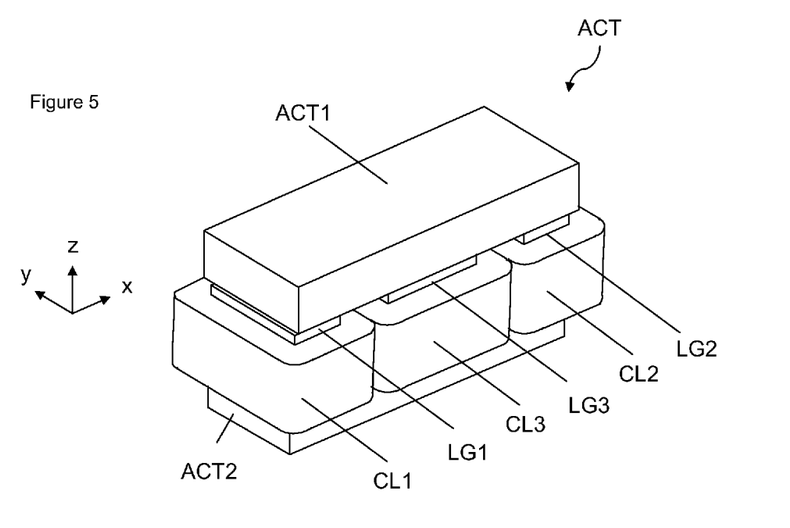
FIG. 5 shows a schematic 3D representation of the actuator according to another embodiment of the invention.

FIG. 5 shows a schematic 3D-representation of the actuator according to the embodiment of the invention of FIG. 4 showing the relative dimensions of the first and second part (ACT1, ACT2) with respect to the coils (CL1,CL2,CL3) and the legs (LG1,LG2,LG3). FIG. 5 shows the actuator, for example, in a local orthogonal xyz co-ordinate system that will be used in the rest of the description. It is noted, that no reference is made to any global coordinate system, because the actual orientation of the actuator is of no concern for a proper functioning of the actuator.

Figure 6:
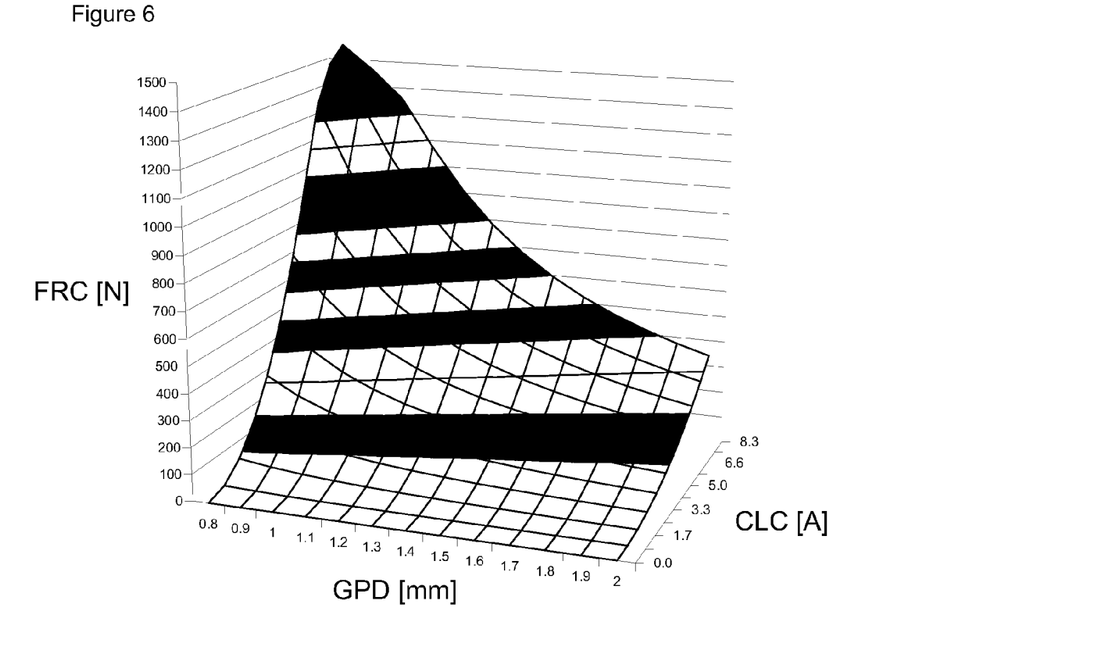
FIG. 6 shows simulation results indicating the normal force as a function of the gap and the applied current.

FIG. 6 shows, as an example, simulation results indicating the driving force (FRC) (in Newton) as function of different gap dimensions (GPD) (in millimeters) between the first part (ACT1) and the second part (ACT2) for different coil current levels (CLC) (in Amperes) wherein the coils (CL1,CL2,CL3) are made up of 150 turns. The actuator (ACT) is, for such a configuration, able to generate force levels up to 1200 Newton with relatively low dissipation levels (typical value 100 Watt for ortho-cyclic wound cupper coils). Such high force levels in combination with such low dissipation levels are not possible with conventionally used actuators, such as voice-coil actuators. The indicated current levels as shown in FIG. 6 are possible when highly permeable laminated cobalt-iron, which has an extreme high magnetic saturation level, is used.

Figure 7:
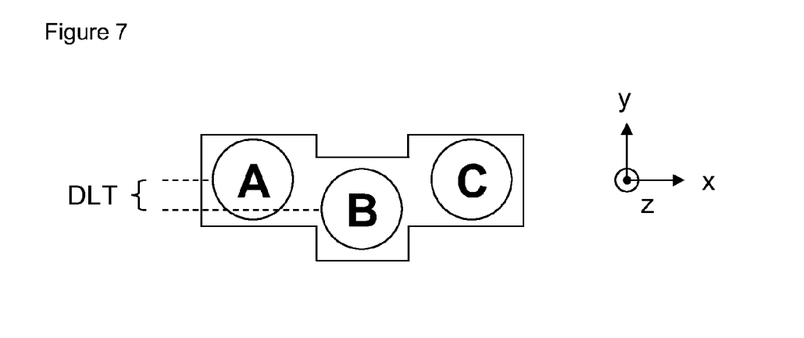
FIG. 7 schematically depicts a top view of an actuator according to yet another embodiment of the invention.

FIG. 7 schematically depicts a top view of an actuator according to yet another embodiment of the invention wherein the electrical coils (CL1,CL2,CL3) have an orientation which is substantially parallel to the first degree of freedom (DOF1, 'z') and wherein the third electrical coil (CL3, 'B') is constructed and arranged with an offset (DLT) with respect to the first electrical coil (CL1, 'A') and the second electrical coil CL2, 'C') in a third degree of freedom (DOF3, 'y'). In such an embodiment the actuator is able to combine a force in one translational direction ('z') with the ability to perform rotations around two other directions (i.e. rotations around direction ('x') and direction ('y')) which directions may be oriented substantially perpendicular to the first direction ('z'). The maximum torque which can be generated around direction ('x') depends amongst others on the amount of the designed offset (DLT) as shown in FIG. 7.

Figure 8:
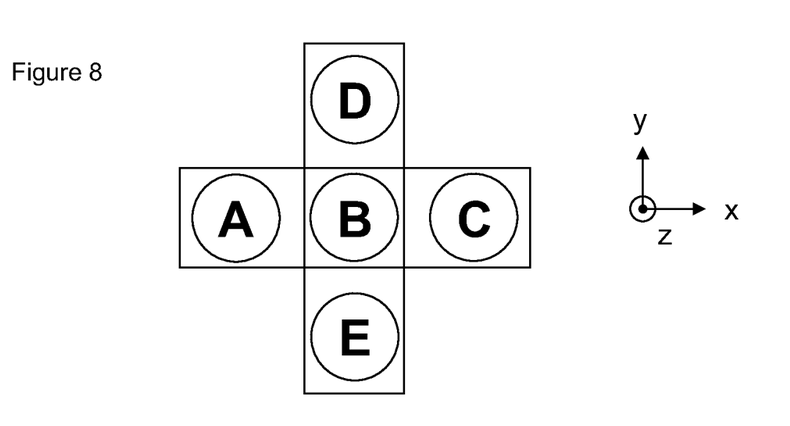
FIG. 8 schematically depicts a top view of an actuator according to a further embodiment of the invention.

FIG. 8 schematically depicts a top view of an actuator according to a further embodiment of the invention. In this embodiment the number of coils is extended from three up to five wherein the coils extend in the directions ('x') and ('y'). Such an actuator may be beneficial with respect to the embodiment of the actuator as shown in FIG. 7 in a situation wherein the actuator also should be able to generate an increased torque around the second direction ('x'). In this embodiment, the central coil ('B') is used to generate torques both around the second direction ('x') and around the third direction ('y'). This may result into mutual influence between the torques around these directions, but for such an influence can however be accounted for and solved when designing the control scheme and setting the control parameters correctly as known in the art. Such an embodiment may be beneficial in a situation wherein a mismatch between the working-line of the force (such as a scanning force) and the centre of gravity of the object to be accelerated is inevitable (which is to some extend always the case). A benefit of such an embodiment of the actuator is that it may be able to compensate for selfinduced parasitic torques itself instead of relying on a second type of actuator, such as a high accuracy but low efficiency voice coil actuator.

Figure 9:
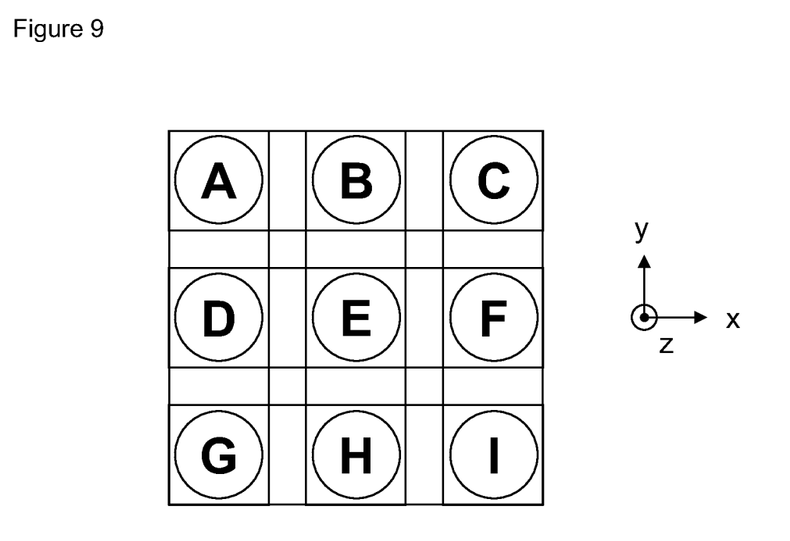
FIG. 9 schematically depicts a top view of an actuator according to another further embodiment of the invention.

FIG. 9 schematically depicts a top view of an actuator according to another further embodiment of the invention. In this embodiment the number of coils is extended up to nine coils ('A' up to 'I') wherein the coil pairs extend in both the second direction ('x') as in the third direction ('y'). Such an actuator may be advantageous with respect to the embodiment of the actuator as shown in FIG. 8 while optimizing the total volume of the magnetic flux guiding material (e.g. cupper), because the use of a commonly used pole (e.g. pole 'B' in FIG. 8) may result in a less efficient use of the magnetic flux guiding material. By generating more central poles as shown in the embodiment according to FIG. 9, such a disadvantage may be reduced. Consequently such a coil configuration results in an even more complex control scheme and matching control settings but this can be accounted for and solved when designing and setting the control parameters such as commonly known in the art.

Figure 10:
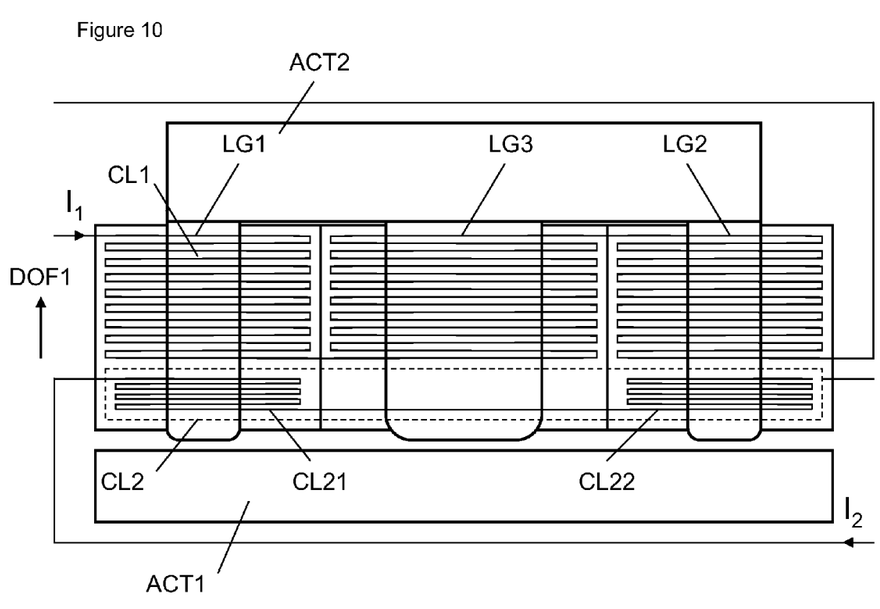
FIG. 10 schematically depicts a cross-section of an actuator according to even a further embodiment of the invention.

FIG. 10 schematically depicts a cross-section of an actuator according to an even further embodiment of the invention. The actuators as described in the previous embodiments may have by design a limited working range between the normal force and the torque. Generation of a torque consequently results in a normal force. While under normal operating conditions a relatively small torque is required with respect to the normal force, especially in the lowest normal force region if a relative high torque is required this may result into undesirable interaction with the normal force. Therefore this even further embodiment of the invention provides an actuator design wherein the first part (ACT1) is provided with the first coil (CL1) including a number of windings (n), wherein the first coil (CL1) is constructed and arranged to generate a relatively large force in the first degree of freedom (DOF1). Furthermore the first part (ACT1) is also provided with the second coil (CL2) including a number of windings less than (n), wherein the second coil (CL2) is constructed and arranged to generate a relatively small torque in a direction that is oriented substantially perpendicular to the first degree of freedom (DOF1). Furthermore legs (LG1,LG2,LG3) are mounted to the first part (ACT1). A first part of the second coil (CL21) has a winding-direction which is similar as that of the adjacent part of the normal force coil (CL1) and a second part of the second coil (CL22) has a winding-direction which is opposite with respect to the adjacent part of the normal force coil (CL1). While applying a second current (I2) on the second electrical coil (CL2) to generate a torque around, at a first side of the actuator the resulting magnetic flux increases because the magnetic flux generated by the first coil (CL1) and the second coil (CL2) work in a similar direction and as a consequence the total magnetic flux at the first side increases in magnitude, whereas at the second and opposite side of the actuator the magnetic flux generated by the first coil (CL1) and the second coil (CL2) work in an opposite direction and as a consequence the total magnetic flux at that side decreases in magnitude. This results in an actuator that is arranged to exert the force and the torque on the object wherein the force and the torque are less coupled with respect to each other. Such an embodiment may be beneficial regarding the controllability in an application wherein small torques in combination with small normal forces is required.

In a further embodiment of the invention a positioning apparatus (APP) for positioning the object (OBJ) with respect to a second object (OBJ2) in the at least first degree of freedom (DOF1) is provided with a positioning system (POS) including at least one actuator (ACT) according to one of the previous embodiments to move the object (OBJ) in the at least first degree of freedom (DOF1). The actuator (ACT) according to an embodiment of the invention is not only able to generate a high normal force, but the actuator (ACT) can also generate a torque while the mass and dimensions of the actuator (ACT) are only limited. This consequently results in a reduced actuator mass compared with a conventional situation wherein at least 2 actuators are required to actuate in two degrees of freedom. Due to the multi-degree-of-freedom (nDOF) characteristics of the proposed actuator (ACT), only a limited number of such actuators are required for the application in, for example, a positioning apparatus in a lithographic apparatus, especially in that direction wherein a high acceleration (i.e. high normal forces) are required such as in the scan direction. Another possibility is to use a positioning apparatus (APP) wherein the actuator (ACT) is considered as an actuator of a first type and wherein the positioning apparatus includes at least one actuator of a second type configured to move the object (OBJ) in at least the first degree of freedom (DOF1) wherein the first type of actuator has a relatively high efficiency and low accuracy and the second type of actuator has a relatively low efficiency and high accuracy. The actuator according to an embodiment of the invention is provided with an improved controllability and consequently a higher accuracy, which actually means that the maximum force that needs to be generated by the low efficiency and high accuracy actuator, such as a voice-coil actuator, can be further reduced. Parasitic torques that result from the mismatch between the working-line of the scanning force and the centre of gravity of the object to be accelerated can be solved to a higher extend by the high efficiency actuator instead of by the high accuracy but low efficient actuator. Consequently this means that a smaller and lighter high accuracy actuator can be used, which is beneficial taking into account the desire to reduce the total weight of the movable portion of the positioning apparatus.

In another embodiment the known lithographic apparatus includes a number of movable objects, which have to be actuated with relatively large accelerations and high accuracy. An example of such a moveable object is a patterning device support (e.g. mask table), which supports a patterning device (e.g. mask) during the projection process (also known as a reticle stage). Such a patterning device support (e.g. mask table) may consist of a well-known stage concept, including a long stroke module and a short stroke module. The long stroke module supports the short stroke module, while the short stroke module is configured to carry the patterning device (e.g. mask). The long stroke module is used for coarse positioning of the patterning device support (e.g. mask table), while the short stroke module is used for fine positioning of the patterning device (e.g. mask) with respect to the projection system. The lithographic apparatus may include a positioning apparatus (APP) as earlier explained wherein the positioning apparatus (APP) includes a long stroke module and a short stroke module wherein the object (OBJ) is the long stroke module and the second part (ACT2) is the short stroke module.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

The invention claimed is:

1. An actuator configured to exert a force and a torque on an object, the actuator comprising:
    a first part and a second part, the first part being movable with respect to the second part in at least a first degree of freedom, wherein the object is mounted to the first part, and wherein one of the parts is provided with a first electrical coil that is arranged to cooperate with a magnetizable portion of the other part;
    a controller arranged to generate a first electrical current through the first electrical coil to generate a force between the first and second parts,
    wherein said one part is provided with a second electrical coil arranged to cooperate with the magnetizable portion of the other part, wherein the controller is further arranged to generate a second current through the second coil to exert the force and torque between the first and second parts so that the actuator is arranged to exert the force and the torque on the object with respect to the second part, and
    wherein one of the parts is provided with a third electrical coil, wherein the third electrical coil is substantially split in half into a first coil member and a second coil member such that the coil members are electrically disconnected and wherein the first coil member is connected in series with the first coil and the second coil member is connected in series with the second coil.

2. The actuator of claim 1, wherein the magnetizable portion of the first part and/or the magnetizable portion of the second part is a highly permeable material.

3. The actuator of claim 1, wherein the first, second and third electrical coils have an orientation which is substantially parallel to the first degree of freedom and wherein the third electrical coil is constructed and arranged with an offset with respect to the first and the second electrical coil in a third degree of freedom.

4. The actuator of claim 1, wherein at least one of the first, second and third electrical coils is constructed and arranged around at least one of a plurality of legs which at least partially consist out of the magnetizable material and wherein the at least one of the legs is mounted to one of the parts.

5. The actuator of claim 1, wherein one of the parts is provided with more than three electrical coils.

6. The actuator of claim 1, wherein the first coil comprises a number of windings (n), wherein the first coil is constructed and arranged to generate a relatively large force in the first degree of freedom, wherein the second coil comprises a number of windings less than (n) and wherein the second coil is constructed and arranged to generate a relatively small torque in a direction that is oriented substantially perpendicular to the first degree of freedom.

7. A positioning apparatus configured to position an object with respect to a second object in a first degree of freedom, wherein the positioning apparatus includes a positioning system comprising at least one actuator according to claim 1 to move the object in the first degree of freedom.

8. The positioning apparatus of claim 7, wherein the actuator is an actuator of a first type and wherein the positioning apparatus comprises at least one actuator of a second type configured to move the object in at least the first degree of freedom, wherein the first type of actuator has a relatively high efficiency and low accuracy and the second type of actuator has a relatively low efficiency and high accuracy.

9. A lithographic apparatus comprising:
    the positioning apparatus according to claim 7, wherein the positioning apparatus comprises a long stroke module and a short stroke module;
    a patterning device support constructed to support a patterning device, the patterning device being capable of imparting a radiation beam with a pattern in a cross-section to form a patterned radiation beam;
    a substrate table constructed to hold a substrate;
    a projection system configured to project the patterned radiation beam onto a target portion of the substrate;
    wherein a movable part of the long stroke module is mounted to the first part and a movable part of the short stroke module is mounted to the second part.

* * * * *